United States Patent
Chih et al.

(10) Patent No.: US 9,852,785 B2
(45) Date of Patent: Dec. 26, 2017

(54) MEMORIES WITH METAL-FERROELECTRIC-SEMICONDUCTOR (MFS) TRANSISTORS

(71) Applicant: Taiwan Semiconductor Manufacturing Co., Ltd., Hsinchu (TW)

(72) Inventors: Yu-Der Chih, Hsinchu (TW); Yun-Sheng Chen, Hsinchu (TW); Chun-Jung Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/166,342

(22) Filed: May 27, 2016

(65) Prior Publication Data

US 2017/0345479 A1    Nov. 30, 2017

(51) Int. Cl.
*G11C 11/22* (2006.01)

(52) U.S. Cl.
CPC ........ *G11C 11/2275* (2013.01); *G11C 11/223* (2013.01); *G11C 11/2273* (2013.01)

(58) Field of Classification Search
CPC ............... G11C 11/2273; G11C 11/2275; G11C 11/223
USPC ............................................. 365/145
See application file for complete search history.

(56) References Cited

U.S. PATENT DOCUMENTS

| 6,067,244 A * | 5/2000 | Ma | G11C 11/22 365/145 |
| 2009/0290404 A1 * | 11/2009 | Kaneko | G11C 11/22 365/145 |

* cited by examiner

Primary Examiner — Huan Hoang
Assistant Examiner — Jay Radke
(74) Attorney, Agent, or Firm — Jones Day

(57) ABSTRACT

A method includes applying a first voltage to a first source line of a memory, applying a second voltage to a second source line of the memory, turning on an access transistor of a memory cell of the memory, and performing one of a write operation or a read operation on a metal-ferroelectric-semiconductor (MFS) transistor of the memory cell. Memories on which the method is performed are also disclosed.

19 Claims, 10 Drawing Sheets

US 9,852,785 B2

MEMORIES WITH METAL-FERROELECTRIC-SEMICONDUCTOR (MFS) TRANSISTORS

BACKGROUND

Typically, a random access memory (RAM) includes memory cells that each store a bit "0" or "1" of data when a write operation is performed thereon that can be retrieved later by performing a read operation. In RAMs, the amount of time to write data thereto is about the same as the amount of time to read data therefrom. A RAM can be volatile or non-volatile. The volatile RAM requires power to retain data stored therein. As opposed to the volatile RAM, the non-volatile RAM ensures data retention even after the power is removed. The memory cells of the volatile RAM, such as a dynamic RAM (DRAM), each include a capacitor that is either in a charged state or a discharged state. These two states represent the two bits of data. However, the capacitor always discharges and will eventually lose its charge, unless the DRAM is periodically refreshed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
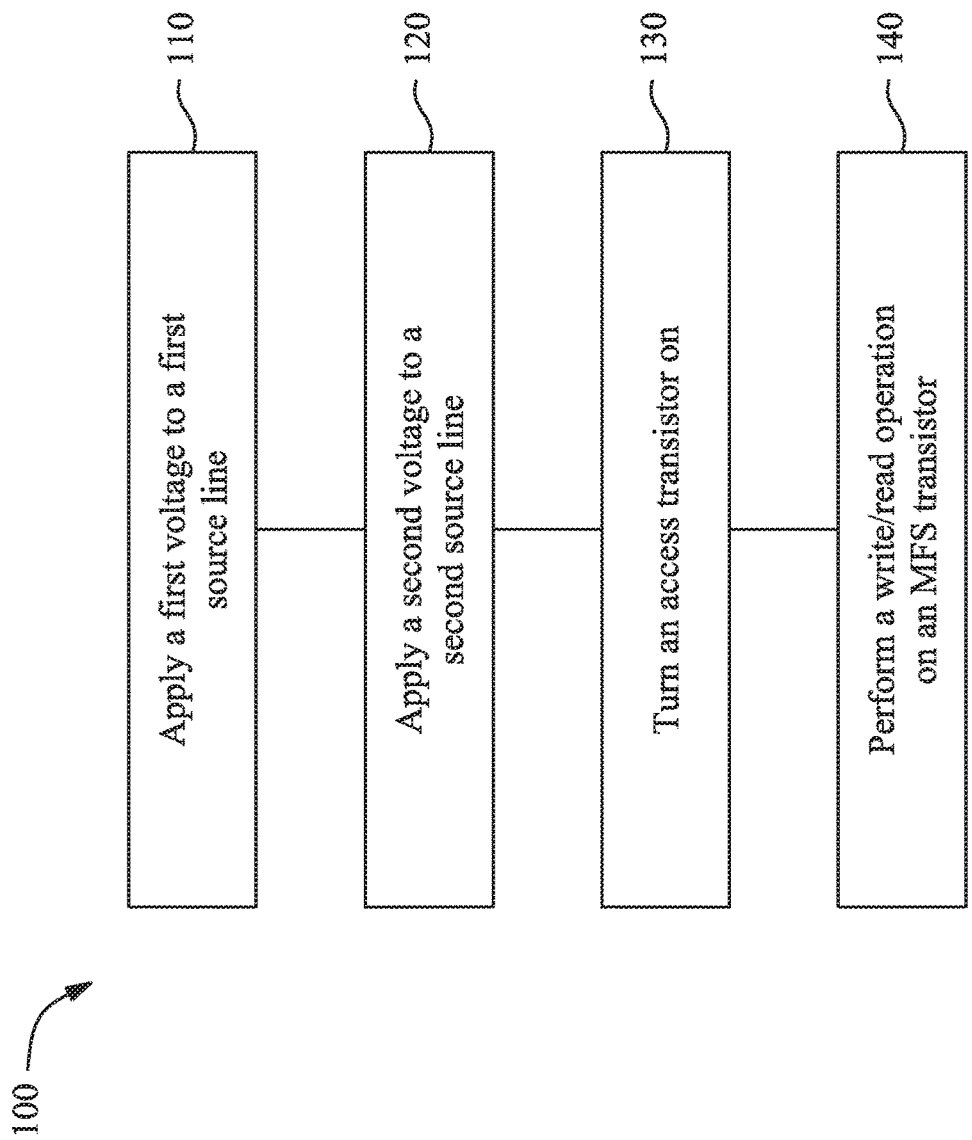
FIG. 1 is a flowchart of an exemplary embodiment of a method of performing a read operation or a write operation on a memory according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure provides various exemplary embodiments of a memory. The memory includes, in some embodiments, an array of 2-T memory cells, and in other embodiments, an array of 3 or more-T memory cells. Each of the memory cells includes a metal-ferroelectric-semiconductor (MFS) transistor. Since the memory includes MFS transistors, the memory of the present disclosure may be termed as a ferroelectric memory (FERAM). The present disclosure also provides a method of performing read and write operations on the FERAM.

A metal-oxide-semiconductor (MOS) transistor includes a substrate, a pair of source and drain regions, a gate material disposed above the substrate and between the source and drain regions, and an insulator material, e.g., oxide, provided between the gate material and the substrate. The MFS transistor has substantially the same structure as the MOS transistor except that the material between the gate material and the substrate thereof is a ferroelectric thin film, such as PZT, $HfO_2$, or any other high-k dielectric materials.

Initially, the ferroelectric thin film of the MFS transistor has no polarity. However, when a write voltage is applied to the gate material of the MFS transistor, a forward or reverse polarity is established in the ferroelectric thin film such that one side thereof is positive and another side thereof is negative. Thereafter, when a read voltage is applied to the gate material of the MFS transistor, a relatively high drain current, e.g., about 8 mA to about 20 mA, or a relatively low or approximately no drain current, e.g., 0 mA to about 0.1 mA, flows through a channel between the source and drain regions. These two drain currents represent bits "0" and "1" of data, whereby data are stored in a FERAM.

An exemplary embodiment of a method 100 of performing a read operation or a write operation on a FERAM, according to some embodiments, is illustrated in FIG. 1. FERAMs that may be used to implement the method 100 are illustrated in FIGS. 2-10. At operation 110, a first voltage is applied to a first source line of the FERAM. At operation 120, a second voltage is applied to a second source line of the FERAM. In some embodiments, the second voltage, e.g., about 1.5 V, is greater than the first voltage, e.g., about 0 V. In some embodiments, the second voltage, e.g., 1.5 V, is less than the first voltage, e.g., about 3 V. In some embodiments, the first and second voltages are substantially equal, e.g., about 0 V. At operation 130, an access transistor of a memory cell of the FERAM is turned on. At operation 140, a read operation or a write operation is performed on an MFS transistor of the memory cell. In this embodiment, operations 110, 120, 130, and 140 are performed substantially simultaneously.

Figure 2:
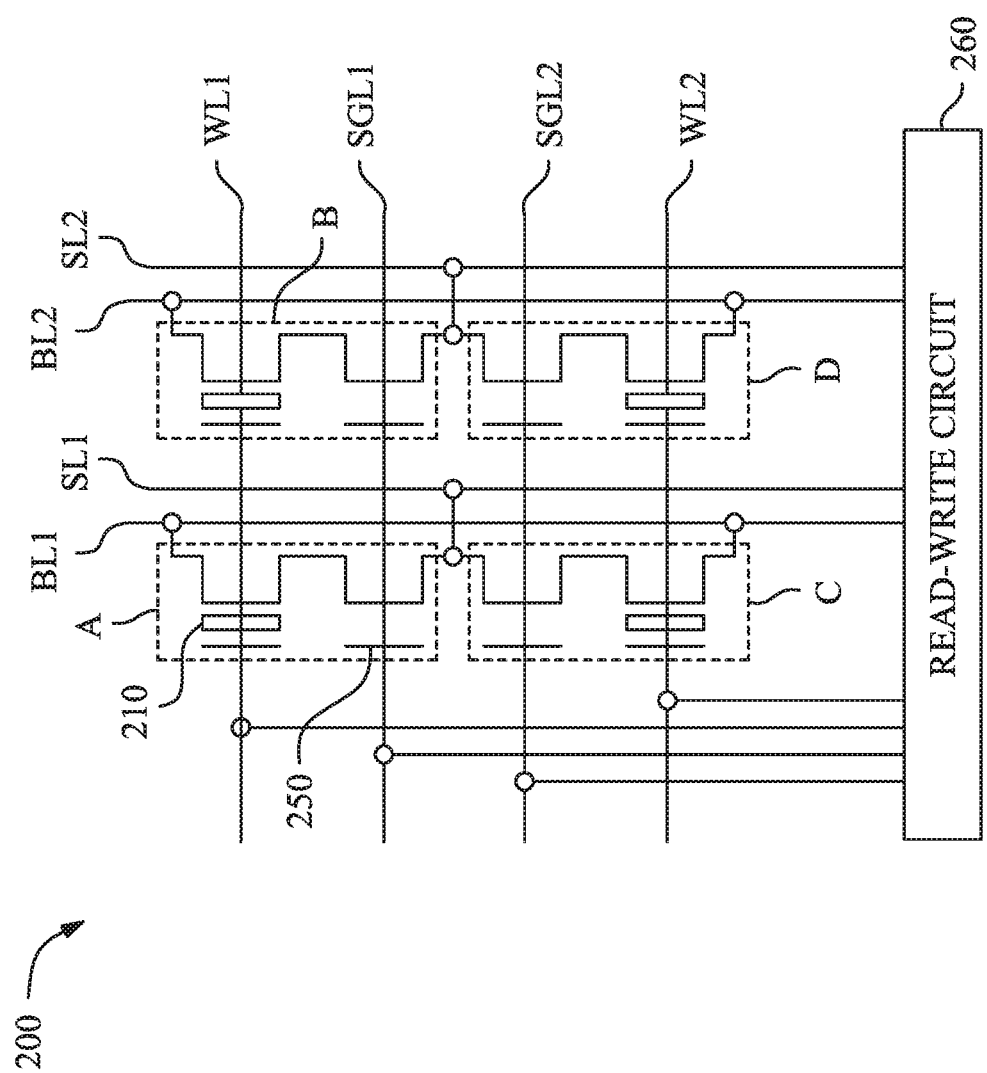
FIG. 2 is a schematic diagram illustrating the first exemplary embodiment of a memory according to some embodiments.

An exemplary embodiment of a FERAM 200, according to some embodiments, is illustrated in FIG. 2. The FERAM 200 includes an array of 2T memory cells (A, B, C, D) that are arranged in a two-by-two matrix of rows and columns. In this embodiment, each of the memory cells (A, B, C, D) includes an MFS transistor 210 and an access transistor 250 (only the MFS transistor 210 and the access transistor 250 of the memory cell (A) is labeled in FIG. 2 for simplicity purpose). Further, in this embodiment, the access transistor 250 is a MOS transistor.

Each of the transistors 210, 250 has a first source/drain terminal, a second source/drain terminal, and a gate terminal. In this embodiment, the MFS transistor 210 and the access transistor 250 are connected in series, e.g., the first source/drain terminals of the MFS transistor 210 and the access transistor 250 are connected to each other.

The FERAM 200 further includes a pair of source lines (SL1, SL2), a pair of select gate lines (SGL1, SGL2), a pair of word lines (WL1, WL2), a pair of bit lines (BL1, BL2), and a read-write circuit 260. Each of the source lines (SL1, SL2) connects the second source/drain terminals of the access transistors 250 of the memory cells (A, B, C, D) in a respective one of the columns. Each of the select gate lines (SGL1, SGL2) connects the gate terminals of the access transistors 250 of the memory cells (A, B, C, D) in a respective one of the rows. Each of the word lines (WL1, WL2) connects the gate terminals of the MFS transistors 210 of the memory cells (A, B, C, D) in a respective one of the rows. Each of the bit lines (BL1, BL2) connects the second source/drain terminals of the MFS transistors 210 of the memory cells (A, B, C, D) in a respective one of the columns.

The read-write circuit 260 is connected to the lines (SGL1, SGL2, WL1, WL2, SL1, SL2, BL1, BL2) and is configured to perform read and write operations on the FERAM 200 in a manner that will be described hereinafter.

The read and write operations on the FERAM 200 will now be described, by way of example, with reference to FIG. 2 and TABLE 1 below. Prior to write operations described below, it is assumed that no polarity exists yet in the ferroelectric thin films of the MFS transistors 210 of the memory cells (A, B, C, D).

Conversely, the read-write circuit 260, in response to a second write command, performs a second write operation, during which the read-write circuit 260 may for example apply: the Vss voltage to the word line (WL1); and the first write voltage to the select gate line (SGL1), the source line (SL1), and the bit line (BL1). As a result, the access transistor 250 of the memory cell (A) is turned on and the ferroelectric thin film of the MFS transistor 210 of the memory cell (A) generates a polarity in a reverse direction opposite to the forward direction. At this time, a bit, e.g., "0" of data, is written to the memory cell (A). Concurrently, the read-write circuit 260 may for example apply: the Vss voltage to the select gate line (SGL2); and the second write voltage to the word line (WL2), the source line (SL2), and the bit line (BL2). As a result, the access transistor 250 of the memory cell (B) is turned on, the access transistors 250 of the memory cells (C, D) are turned off, and still no polarity exists in the ferroelectric thin films of the MFS transistors 210 of the memory cells (B, C, D).

Subsequent to the first or second write operation described above, the read-write circuit 260 performs write operations, which are similar to the above-described first or second write operation, on the memory cells (B, C, D), and during which the ferroelectric thin films of the MFS transistors 210 each generate a polarity in the forward or reverse direction, whereby bits "1s" and "0s" are stored in the memory cells (B, C, D).

After the first or second write operation, the read-write circuit 260, in response to a read command, performs a read operation, during which the read-write circuit 260 may for example apply: a Vdd voltage to the select gate line (SGL1); a first read voltage to the word line (WL1); the Vss voltage

TABLE 1

|  | SGL1 | SGL2 | WL1 | WL2 | SL1 | SL2 | BL1 | BL2 |
|---|---|---|---|---|---|---|---|---|
| WRITE "1" | 1st write voltage | Vss voltage | 1st write voltage | 2nd write voltage | Vss voltage | 2nd write voltage | Vss voltage | 2nd write voltage |
| WRITE "0" | 1st write voltage | Vss voltage | Vss voltage | 2nd write voltage | 1st write voltage | 2nd write voltage | 1st write voltage | 2nd write voltage |
| READ | Vdd voltage | Vss voltage | 1st write voltage | Vss voltage | Vss voltage | Vss voltage | 2nd write voltage | Vss voltage |

The read-write circuit 260, in response to a first write command, performs a first write operation, during which the read-write circuit 260 may for example apply: a first write voltage to the select gate line (SGL1) and the word line (WL1); and a Vss voltage to the source line (SL1) and the bit line (BL1). As a result, the access transistor 250 of the memory cell (A) is turned on and the ferroelectric thin film of the MFS transistor 210 of the memory cell (A) generates a polarity in a forward direction. At this time, a bit, e.g., "1" of data, is written to or stored in the memory cell (A). Concurrently, the read-write circuit 260 may for example apply: the Vss voltage to the select gate line (SGL2); and a second write voltage to the word line (WL2), the source line (SL2), and the bit line (BL2). As a result, the access transistor 250 of the memory cell (B) is turned on, the access transistors 250 of the memory cells (C, D) are turned off, and still no polarity exists in the ferroelectric thin films of the MFS transistors 210 of the memory cells (B, C, D).

In some embodiments, the first write voltage, e.g., about 3 V, is greater than the Vss voltage, e.g., about 0 V. In some embodiments, the second write voltage is greater than the Vss voltage and less than, e.g., one half of, the first write voltage.

to the source line (SL1); and a second read voltage to the bit line (BL1). As a result, the access transistor 250 of the memory cell (A) is turned on, and a high drain current, e.g., about 8 mA to about 20 mA, or a low drain current, e.g., about 0 mA to about 0.1 mA, flows through the memory cell (A). At this time, a bit "0" or "1" is read or retrieved from the memory cell (A). Concurrently, the read-write circuit 260 may for example apply the Vss voltage to the select gate line (SGL2), the word line (WL2), the source line (SL2), and the bit line (BL2). As a result, the access transistor 250 of the memory cell (B) is turned on, the access transistors 250 of the memory cells (C, D) are turned off, and no read disturbance is caused in, i.e., no reversal of the polarities of, the ferroelectric thin films of the MFS transistors 210 of the memory cells (B, C, D).

In some embodiments, the Vdd voltage is, e.g., about 1 V, greater than a threshold voltage of the access transistor 250. In some embodiments, the first read voltage, e.g., about 0 V or more, is less than the Vdd voltage. In some embodiments, the second read voltage, e.g., about 0.5 V, is greater than the first read voltage.

Subsequent to the read operation described above, the read-write circuit 260 performs read operations, which are similar to the above-described read operation, and during which the MFS transistors 210 each generate a low or high drain current, whereby bits "0s" and "1s" are retrieved from the memory cells (B, C, D).

Figure 3:
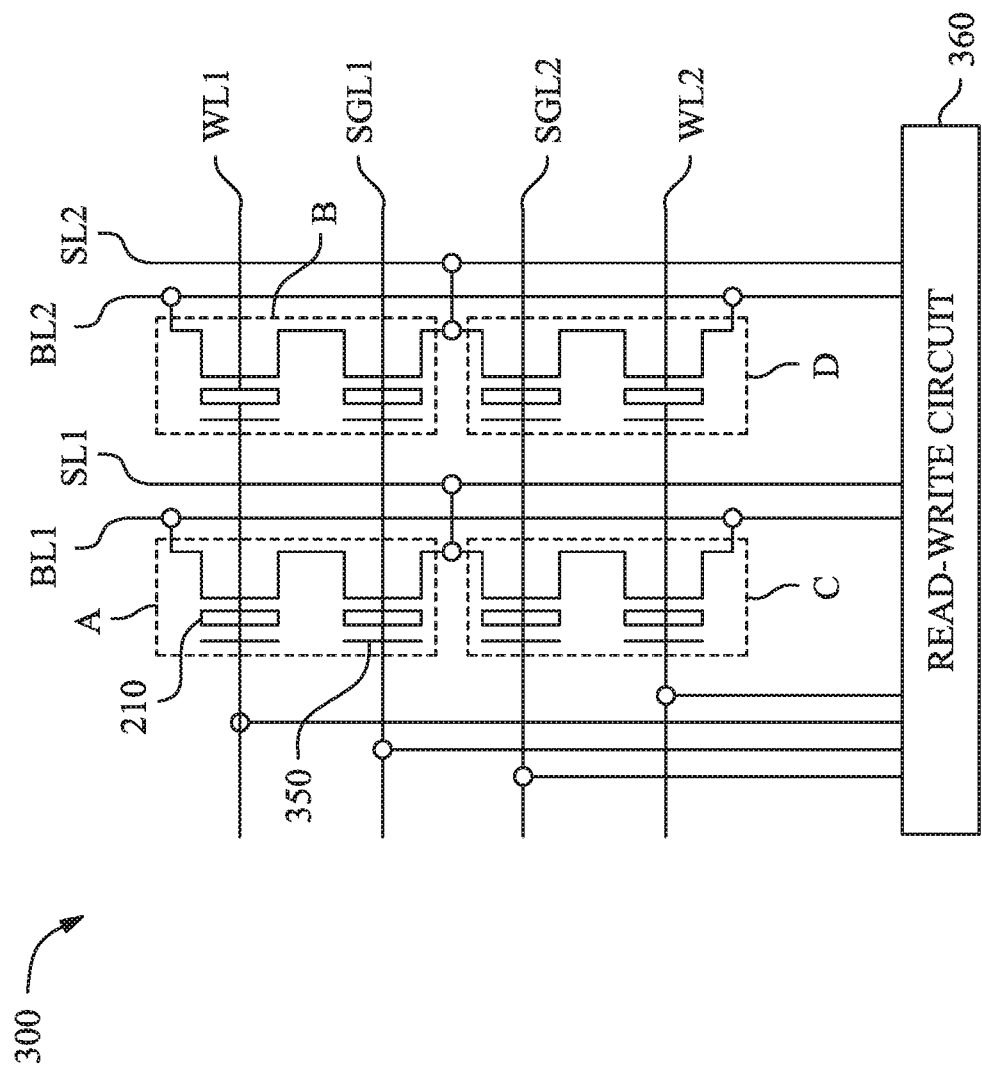
FIG. 3 is a schematic diagram illustrating the second exemplary embodiment of a memory according to some embodiments.

An exemplary embodiment of an FERAM 300, according to some embodiments, is illustrated in FIG. 3. This embodiment differs from the previous embodiment in that the access transistors 350 of the memory cells (A, B, C, D) of the FERAM 300 are each an MFS transistor. The read-write circuit 360 of the FERAM 300 is configured to perform read and write operations on the FERAM 300, in a manner similar to those described heretofore.

Figure 4:
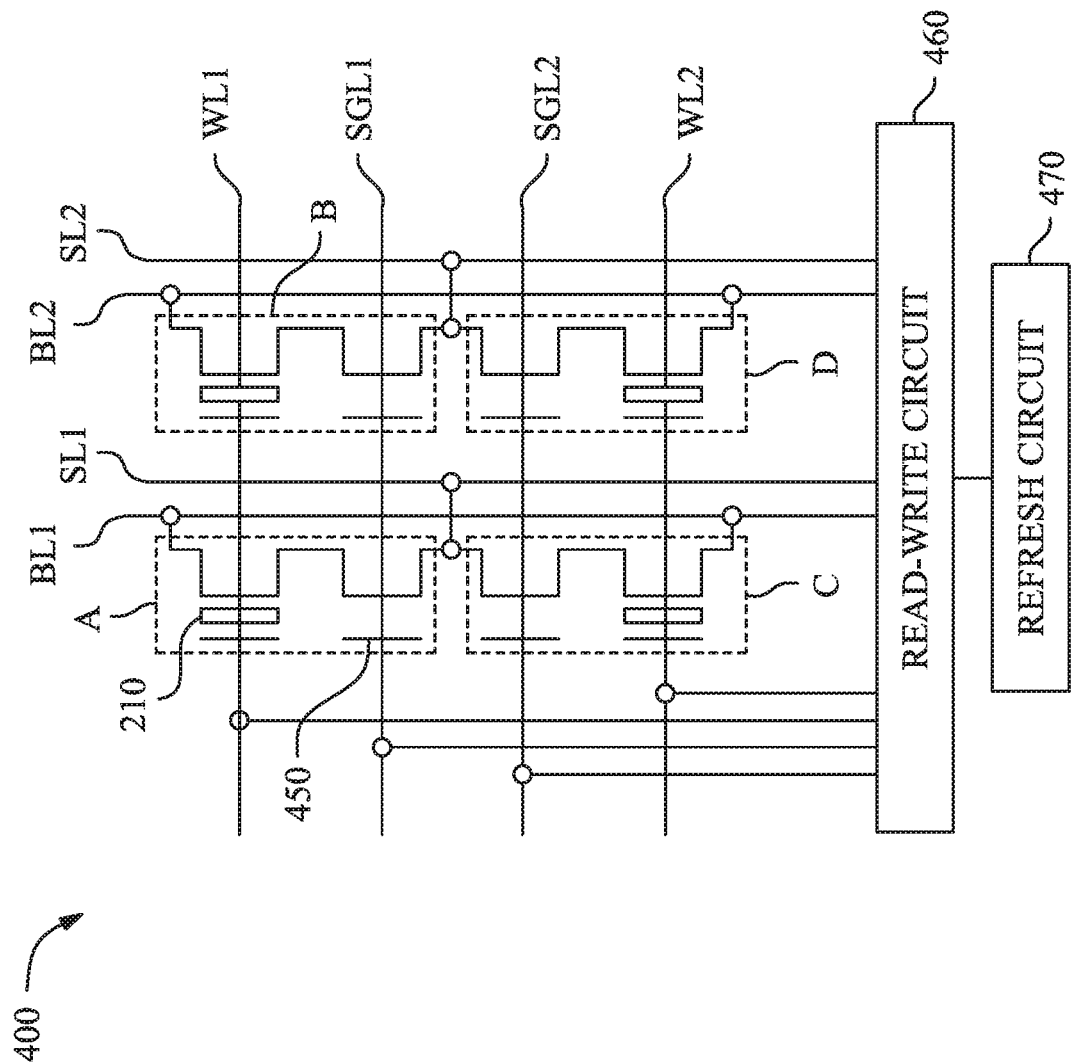
FIG. 4 is a schematic diagram illustrating the third exemplary embodiment of a memory according to some embodiments.

An exemplary embodiment of an FERAM 400, according to some embodiments, is illustrated in FIG. 4. This embodiment differs from the previous embodiments in that the access transistors 450 of the memory cells (A, B, C, D) of the FERAM 400 are each a MOS transistor. The read-write circuit 460 of the FERAM 400 is configured to perform read and write operations on the FERAM 400, in a manner similar to those described heretofore.

The FERAM 400 is further configured to preserve the bits of data written to the memory cells (A, B, C, D) thereof. In particular, the FERAM 400 further includes a refresh circuit 470 connected to the read-write circuit 460 and configured to, e.g., periodically, generate a refresh command. The read-write circuit 460 is further configured to read data from the memory cells (A, B, C, D) and to write the data read thereby back to the memory cells (A, B, C, D) in response to the refresh command.

Figure 5:
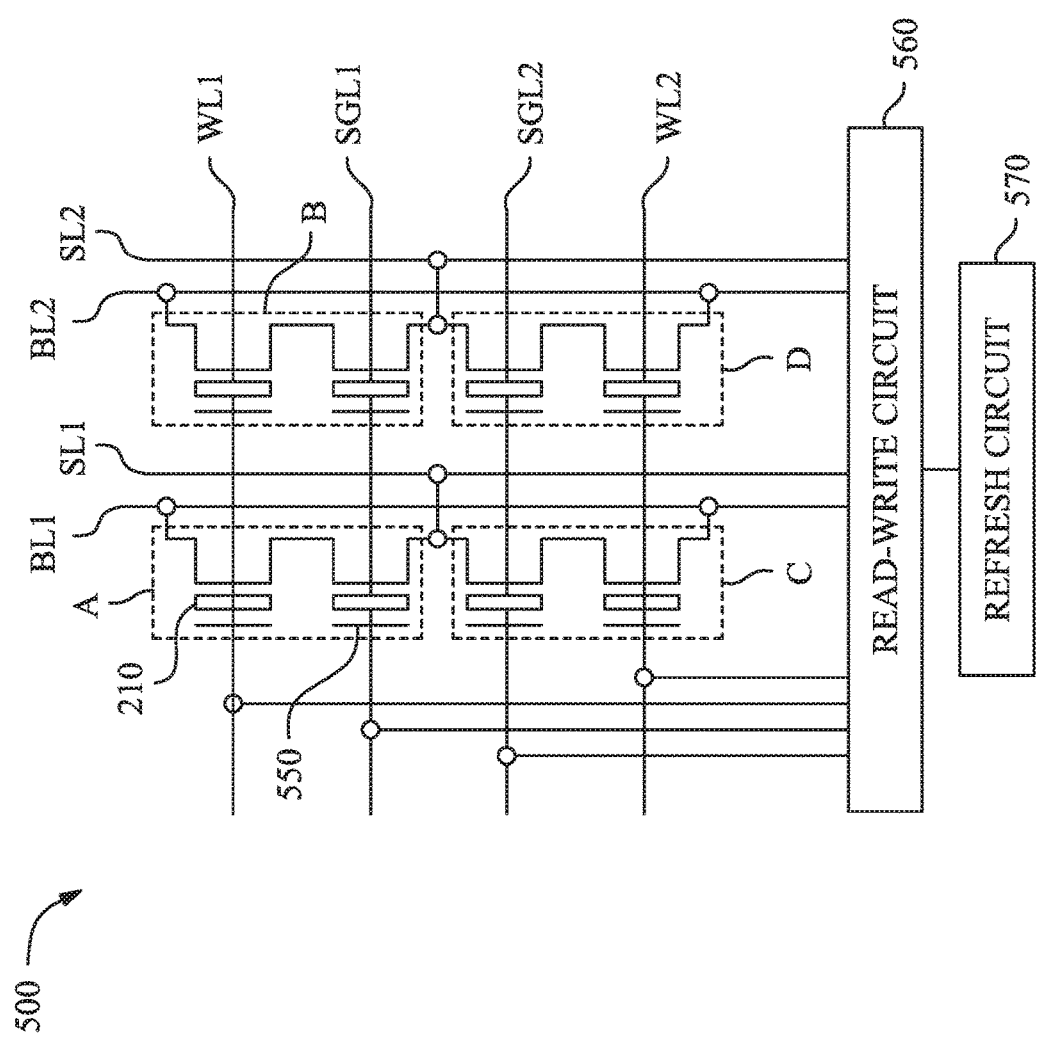
FIG. 5 is a schematic diagram illustrating the fourth exemplary embodiment of a memory according to some embodiments.

An exemplary embodiment of an FERAM 500, according to some embodiments, is illustrated in FIG. 5. This embodiment differs from the previous embodiments in that the access transistors 550 of the memory cells (A, B, C, D) of the FERAM 500 are each an MFS transistor. The read-write circuit 560 of the FERAM 500 is configured to perform read and write operations on the FERAM 500, in a manner similar to those described heretofore. The refresh circuit 570 of the FERAM 500 is connected to the read-write circuit 560 and is configured to, e.g., periodically, generate a refresh command. The read-write circuit 560 is further configured to read data from the memory cells (A, B, C, D) and to write the data read thereby back to the memory cells (A, B, C, D) in response to the refresh command so as to preserve the bits of data stored in the memory cells (A, B, C, D).

Figure 6:
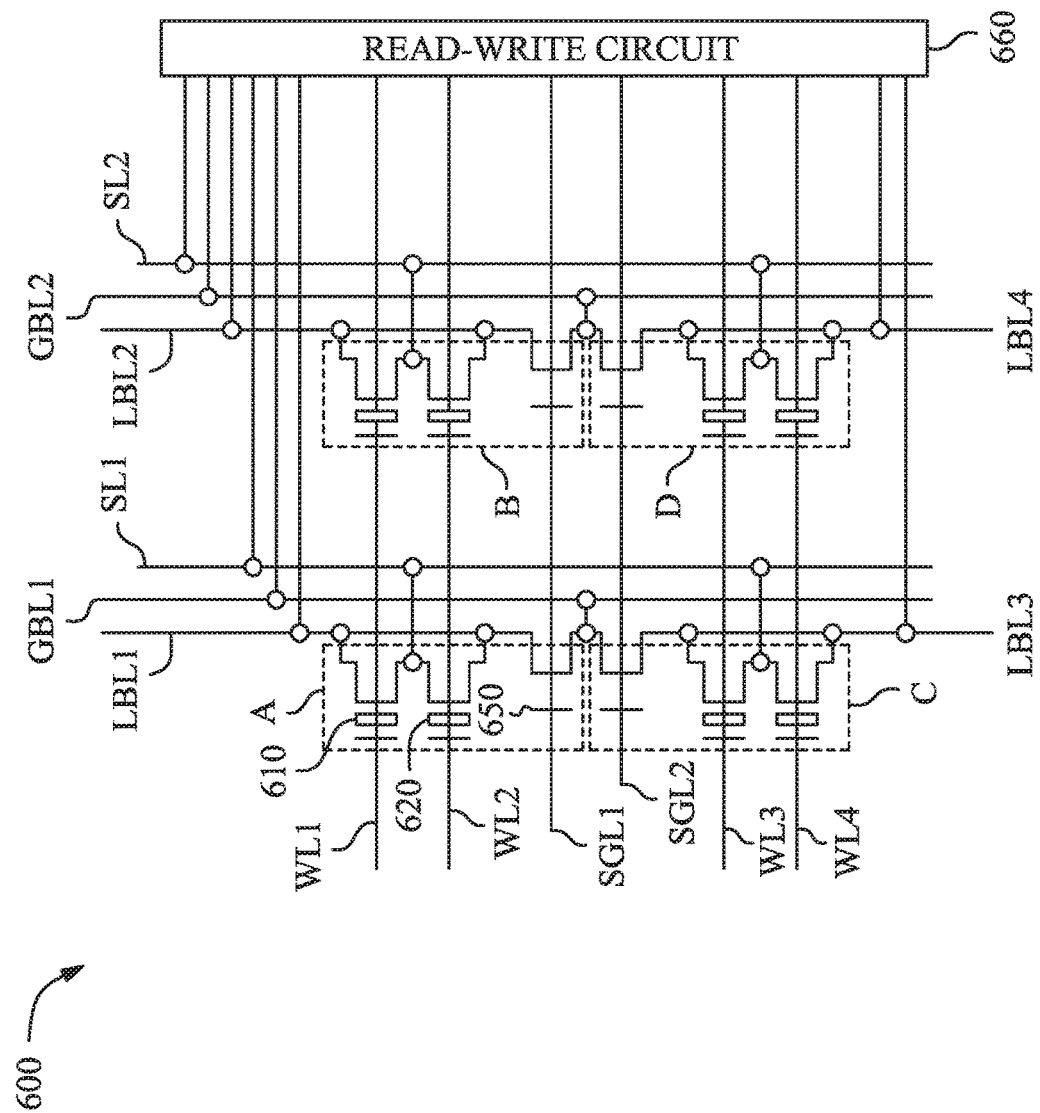
FIG. 6 is a schematic diagram illustrating the fifth exemplary embodiment of a memory according to some embodiments.

An exemplary embodiment of a FERAM 600, according to some embodiments, is illustrated in FIG. 6. The FERAM 600 includes an array of 3T memory cells (A, B, C, D) that are arranged in a two-by-two matrix of rows and columns. In this embodiment, each of the memory cells (A, B, C, D) includes a pair of MFS transistors 610, 620 and an access transistor 650 (only the MFS transistors 610, 620 and the access transistor 650 of the memory cell (A) is labeled in FIG. 6 for simplicity purpose). Further, in this embodiment, the access transistor 650 is a MOS transistor.

Each of the transistors 610, 620, 650 includes a first source/drain terminal, a second source/drain terminal, and a gate terminal. The FERAM 600 further includes a pair of select gate lines (SGL1, SGL2), two pairs of word lines (WL1, WL2, WL3, WL4), a pair of source lines (SL1, SL2), a pair of global bit lines (GBL1, GBL2), and two pairs of local bit lines (LBL1, LBL2, LBL3, LBL4), and a read-write circuit 660.

Each of the select gate lines (SGL1, SGL2) connects the gate terminals of the access transistors 650 of the memory cells (A, B, C, D) in a respective one of the rows. Each of the word lines (WL1, WL2) connects the gate terminal of a respective one of the MFS transistors 610, 620 of the memory cell (A) and the gate terminal of a respective one of the MFS terminal transistors 610, 620 of the memory cell (B). Each of the word lines (WL3, WL4) connects the gate terminal of a respective one of the MFS transistors 610, 620 of the memory cell (C) and the gate terminal of a respective one of the MFS terminal transistors 610, 620 of the memory cell (D). Each of the source lines (SL1, SL2) connects the first source/drain terminals of the MFS transistors 610, 620 of the memory cells (A, B, C, D) in a respective one of the columns. Each of the global bit lines (GBL1, GBL2) connects the first source/drain terminals of the access transistors 650 of the memory cells (A, B, C, D) in a respective one of the columns. Each of the local bit lines (LBL1, LBL2, LBL3, LBL4) connects the second source/drain terminals of the MFS transistors 610, 620 and the second source/drain terminal of the access transistor 650 of a respective one of the memory cells (A, B, C, D).

The read-write circuit 660 is connected to the lines (SGL1, SGL2, WL1, WL2, WL3, WL4, SL1, SL2, GBL1, GBL2, LBL1, LBL2, LBL3, LBL4) and is configured to perform read and write operations on the FERAM 600, in a manner that will be described hereinafter.

The read and write operations on the FERAM 600 will now be described, by way of example, with reference to FIG. 6 and TABLES 2A and 2B below. Prior to write operations described below, it is assumed that no polarity exists yet in the ferroelectric thin films of the MFS transistors 610, 620 of the memory cells (A, B, C, D).

TABLE 2A

|  | SGL1 | SGL2 | WL1 | WL2 | WL3 | WL4 | SL1 |
| --- | --- | --- | --- | --- | --- | --- | --- |
| WRITE "1" | $1^{st}$ write voltage | Vss voltage | $1^{st}$ write voltage | $2^{nd}$ write voltage | $2^{nd}$ write voltage | $2^{nd}$ write voltage | Vss voltage |
| WRITE "0" | $1^{st}$ write voltage | Vss voltage | Vss voltage | $2^{nd}$ write voltage | $2^{nd}$ write voltage | $2^{nd}$ write voltage | $1^{st}$ write voltage |
| READ | Vdd voltage | Vss voltage | $1^{st}$ write voltage | Negative voltage | Vss or negative voltage | Vss or negative voltage | Vss voltage |

TABLE 2B

|  | SL2 | GBL1 | GBL2 | LBL1 | LBL2 | LBL3 | LBL4 |
| --- | --- | --- | --- | --- | --- | --- | --- |
| WRITE "1" | $2^{nd}$ write voltage | Vss voltage | $2^{nd}$ write voltage | GBL1 | CBL2 | Vss voltage | Vss or $2^{nd}$ write voltage |

TABLE 2B-continued

|  | SL2 | GBL1 | GBL2 | LBL1 | LBL2 | LBL3 | LBL4 |
|---|---|---|---|---|---|---|---|
| WRITE "0" | 2$^{nd}$ write voltage | 1$^{st}$ write voltage | 2$^{nd}$ write voltage | GBL1 | CBL2 | Vss voltage | Vss or 2$^{nd}$ write voltage |
| READ | Vss voltage | 2$^{nd}$ write voltage | Vss voltage | GBL1 | CBL2 | Vss voltage | Vss voltage |

The read-write circuit 660, in response to a first write command, performs a first write operation, during which the read-write circuit 660 may for example apply: a first write voltage to the select gate line (SGL1) and the word line (WL1); a second write voltage to the word line (WL2); and a Vss voltage to the source line (SL1) and the global bit line (GBL1). As a result, the access transistor 650 of the memory cell (A) is turned on, thereby impressing the Vss voltage applied to the global bit line (GBL1) on the local bit line (LBL1), and the ferroelectric thin film of the MFS transistor 610 of the memory cell (A) generates a polarity in a forward direction. At this time, a bit, e.g., "1" of data, is written to or stored in the MFS transistor 610 of the memory cell (A). Concurrently, the read-write circuit 660 may for example apply: the Vss voltage to the select gate line (SGL2) and the local bit line (LBL3); the second write voltage to the word lines (WL3, WL4), the source line (SL2), and the global bit line (GBL2); and the Vss voltage or the second write voltage to the (LBL4). As a result, the access transistor 650 of the memory cell (B) is turned on, thereby impressing the second write voltage applied to the global bit line (GBL2) on the local bit line (LBL2), the access transistors 650 of the memory cells (C, D) are turned off, and still no polarity exists in the ferroelectric thin films of the MFS transistors 610 of the memory cells (B, C, D) and the ferroelectric thin films of the MFS transistors 620 of the memory cells (A, B, C, D).

In some embodiments, the first write voltage, e.g., about 3 V, is greater than the Vss voltage, e.g., about 0 V. In some embodiments, the second write voltage is greater than the Vss voltage and less than, e.g., one half of, the first write voltage.

Conversely, the read-write circuit 660, in response to a second write command, performs a second write operation, during which the read-write circuit 660 may for example apply: the first write voltage to the select gate line (SGL1), the source line (SL1), and the global bit line (GBL1); the Vss voltage to the word line (WL1); and the second write voltage to the word line (WL2). As a result, the access transistor 650 of the memory cell (A) is turned on, thereby impressing the first write voltage applied to the global bit line (GBL1) on the local bit line (LBL1), and the MFS transistor 610 of the memory cell (A) generates a polarity in a reverse direction opposite to the forward direction. At this time, a bit, e.g., "0" of data, is written to the MFS transistor 610 of the memory cell (A). Concurrently, the read-write circuit 660 may for example apply: the Vss voltage to the (SGL2) and the (LBL3); the second write voltage to the word lines (WL3, WL4) and the source line (SL2), and the global bit line (GLB2); and the second write voltage or the Vss voltage to the local bit line (LBL4). As a result, the access transistor 650 of the memory cell (B) is turned on, thereby impressing the second write voltage applied to the global bit line (GBL2) on the local bit line (LBL2), the access transistors 650 of the memory cells (C, D) are turned off, and still no polarity exists in the ferroelectric thin films of the MFS transistors 610 of the memory cells (B, C, D) and the ferroelectric thin films of the MFS transistors 620 of the memory cells (A, B, C, D).

Subsequent to the first or second write operation described above, the read-write circuit 660 performs write operations, which are similar to the above-described first or second write operation, on the MFS transistors 610 of the memory cells (B, C, D) and the MFS transistors 620 of the memory cells (A, B, C, D), and during which the ferroelectric thin films of the MFS transistors 610 of the memory cells (B, C, D) and the ferroelectric thin films of the MFS transistors 620 of the memory cells (A, B, C, D) each generate a polarity in the forward or reverse direction, whereby bits "1s" and "0s" are stored in the MFS transistors 610 of the memory cells (B, C, D) and the MFS transistors 620 of the memory cells (A, B, C, D).

After the first or second write operation, the read-write circuit 660, in response to a read command, performs a read operation, during which the read-write circuit 660 may for example apply: a Vdd voltage to the select gate line (SGL1); a first read voltage to the word line (WL1); a negative voltage to the word line (WL2); the Vss voltage to the source line (SL1); and a second read voltage to the global bit line (GBL1). As a result, the access transistor 650 of the memory cell (A) is turned on, thereby impressing the second read voltage applied to the global bit line (GBL1) on the local bit line (LBL1), and a high drain current, e.g., about 8 mA to about 20 mA, or a low drain current, e.g., about 0 mA to about 0.1 mA, flows through the MFS transistor 610 of the memory cell (A). At this time, a bit "0" or "1" is read or retrieved from the MFS transistor 610 of the memory cell (A). Concurrently, the read-write circuit 660 may for example apply: the Vss voltage to the select gate line (SGL2), the source line (SL2), the global bit line (GBL2), and the local bit lines (LBL3, LBL4); and the Vss voltage or the negative voltage to the word lines (WL3, WL4). As a result, the access transistor 650 of the memory cell (B) is turned on, thereby impressing the Vss voltage applied to the global bit line (GLB2) on the local bit line (LBL2), the access transistors 650 of the memory cells (C, D) are turned off, and no read disturbance is caused in, i.e., no reversal of the polarities of, the ferroelectric thin films of the MFS transistors 610 of the memory cells (B, C, D) and the ferroelectric thin films of the MFS transistors 620 of the memory cells (A, B, C, D).

In some embodiments, the Vdd voltage is, e.g., about 1 V, greater than a threshold voltage of the access transistor 650. In some embodiments, the first read voltage, e.g., about 0 V or more, is less than the Vdd voltage. In some embodiments, the second read voltage, e.g., about 0.5 V, is greater than the first read voltage.

Subsequent to the read operation described above, the read-write circuit 660 performs read operations, which are similar to the above-described read operation, and during which the MFS transistors 610 of the memory cells (B, C, D) and the MFS transistors 620 of the memory cells (A, B, C, D) each generate a low or high drain current, whereby bits "0s" and "1s" are retrieved from the MFS transistors 610 of the memory cells (B, C, D) and the MFS transistors 620 of the memory cells (A, B, C, D).

Figure 7:
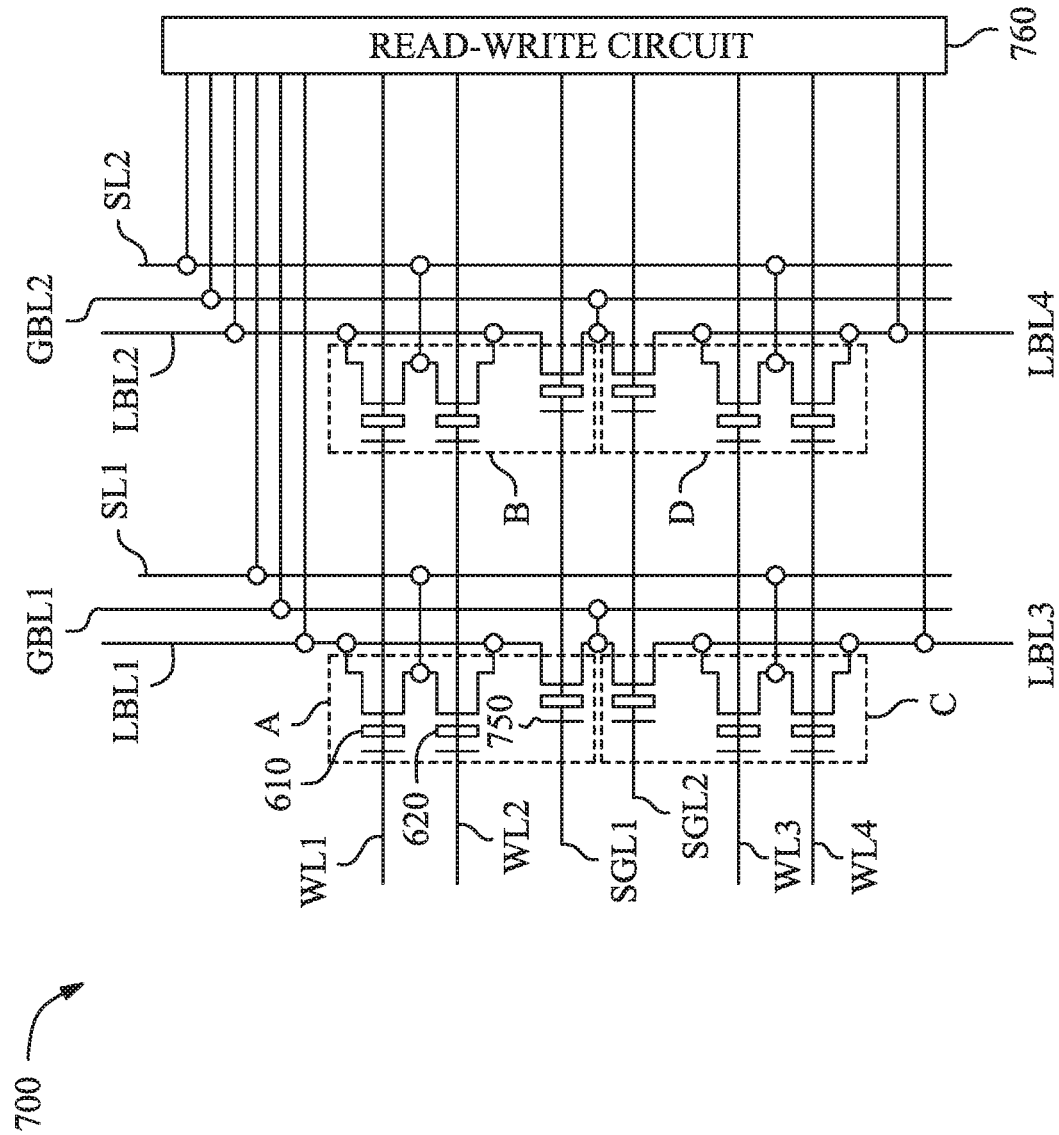
FIG. 7 is a schematic diagram illustrating the sixth exemplary embodiment of a memory according to some embodiments.

An exemplary embodiment of an FERAM 700, according to some embodiments, is illustrated in FIG. 7. This embodiment differs from the FERAM 600 illustrated in FIG. 6 in that the access transistors 750 of the memory cells (A, B, C, D) of the FERAM 700 are each an MFS transistor. The read-write circuit 760 of the FERAM 700 is configured to perform read and write operations on the FERAM 700, in a manner similar to those described above with respect to FERAM 600.

Figure 8:
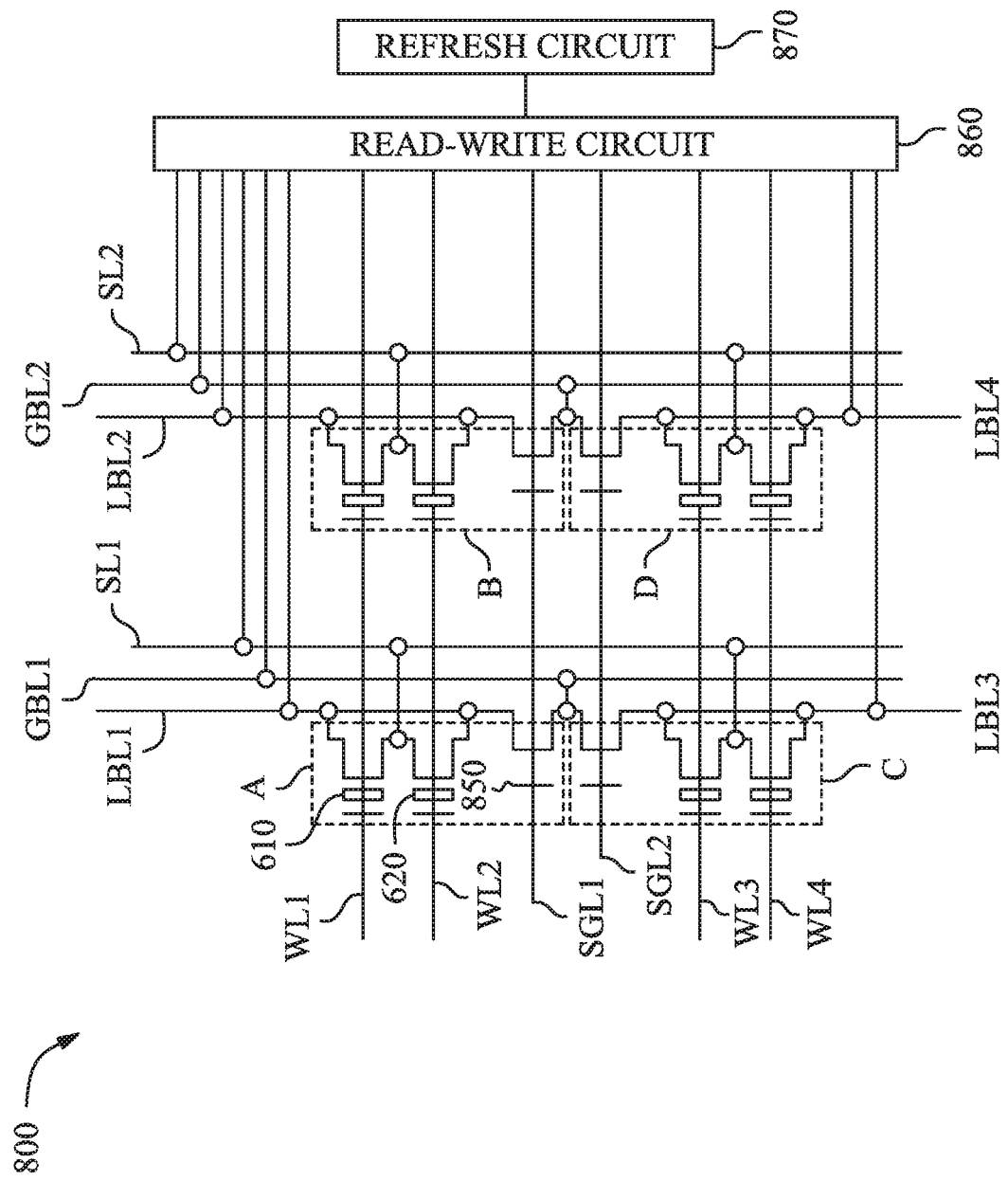
FIG. 8 is a schematic diagram illustrating the seventh exemplary embodiment of a memory according to some embodiments.

An exemplary embodiment of an FERAM 800, according to some embodiments, is illustrated in FIG. 8. This embodiment differs from the FERAMs 600, 700 illustrated in FIGS. 6 and 7, respectively, in that the access transistors 850 of the memory cells (A, B, C, D) of the FERAM 800 are each a MOS transistor. The read-write circuit 860 of the FERAM 800 is configured to perform read and write operations on the FERAM 800, in a manner similar to those described above with respect to the FERAM 600.

The FERAM 800 is further configured to preserve the bit of data written to the memory cells (A, B, C, D) thereof. In particular, the FERAM 800 further includes a refresh circuit 870 connected to the read-write circuit 860 and configured to, e.g., periodically, generate a refresh command. The read-write circuit 860 is further configured to read data from the memory cells (A, B, C, D) and to write the data read thereby back to the memory cells (A, B, C, D) in response to the refresh command.

Figure 9:
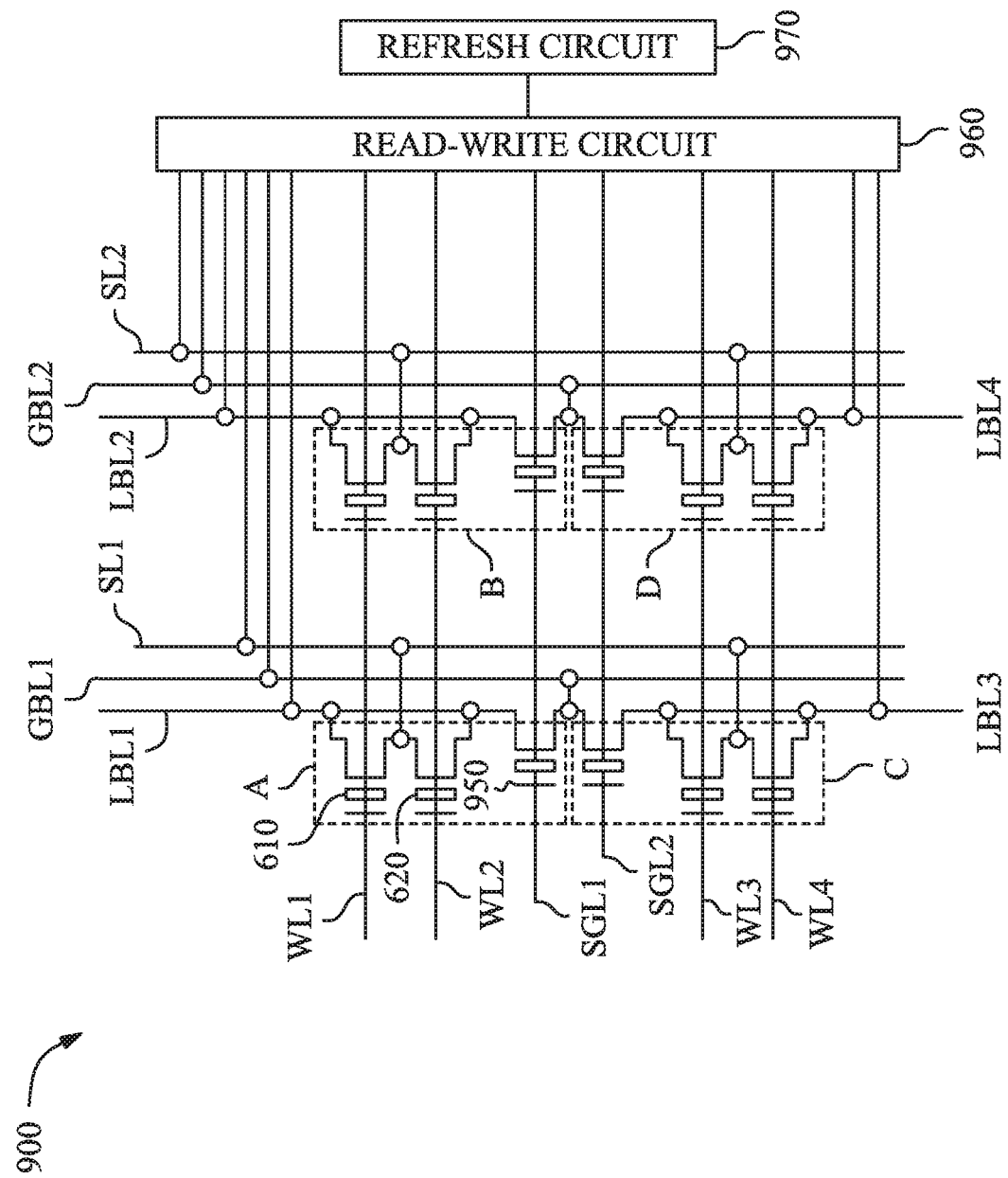
FIG. 9 is a schematic diagram illustrating the eighth exemplary embodiment of a memory according to some embodiments.

An exemplary embodiment of an FERAM 900, according to some embodiments, is illustrated in FIG. 9. This embodiment differs from the FERAMs 600, 700, 800 illustrated in FIGS. 6, 7, and 8, respectively, in that the access transistors 950 of the memory cells (A, B, C, D) of the FERAM 900 are each an MFS transistor. The read-write circuit 960 of the FERAM 900 is configured to perform read and write operations on the FERAM 900, in a manner similar to those described above with respect to the FERAM 600. The refresh circuit 970 of the FERAM 900 is connected to the read-write circuit 960 and is configured to, e.g., periodically, generate a refresh command. The read-write circuit 960 is further configured to read data from the memory cells (A, B, C, D) and to write the data read thereby back to the memory cells (A, B, C, D) in response to the refresh command so as to preserve the bits of data stored in the memory cells (A, B, C, D).

Figure 10:
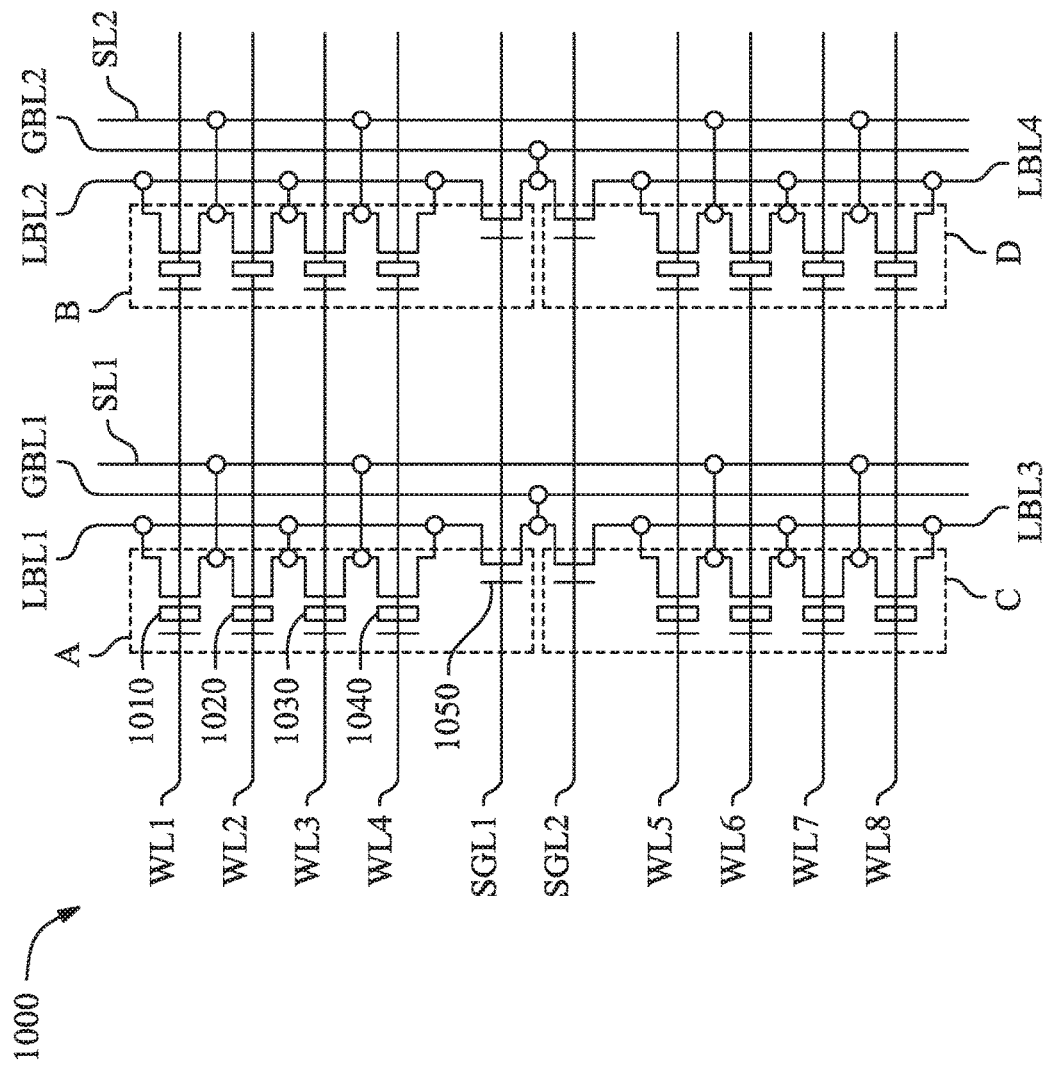
FIG. 10 is a schematic diagram illustrating the ninth exemplary embodiment of a memory according to some embodiments.

Although the memory cell, e.g., the memory cell (A) of FERAM 600, is exemplified including only a pair of MFS transistors 610, 620 that share the access transistor 650, it should be understood that the number of MFS transistors that share the access transistors 650 may be increased as required. An exemplary embodiment of such a FERAM 1000, according to some embodiments, is illustrated in FIG. 10. The FERAM 1000 includes a two-by-two array of 5T memory cells (A, B, C, D), each of which includes a two pairs of MFS transistors 1010, 1020, 1030, 1040 and an access transistor 1050 (only the MFS transistors 1010, 1020, 1030, 1040 and the access transistor 1050 of the memory cell (A) is labeled in FIG. 10 for simplicity purpose). In this embodiment, the access transistor 1050 is a MOS transistor. In alternative embodiment, the access transistor 1050 is an MFS transistor.

Each of the transistors 1010, 1020, 1030, 1040, 1050 includes a first source/drain terminal, a second source/drain terminal, and a gate terminal. The FERAM 1000 further includes a pair of select gate lines (SGL1, SGL2), four pairs of word lines (WL1, WL2, WL3, WL4, WL5, WL6, WL7, WL8), a pair of source lines (SL1, SL2), a pair of global bit lines (GBL1, GBL2), and two pairs of local bit lines (LBL1, LBL2, LBL3, LBL4).

Each of the select gate lines (SGL1, SGL2) connects the gate terminals of the access transistors 1050 of the memory cells (A, B, C, D) in a respective one of the rows. Each of the word lines (WL1, WL2, WL3, WL4) connects the gate terminal of a respective one of the MFS transistors 1010, 1020, 1030, 1040 of the memory cell (A) and the gate terminal of a respective one of the MFS transistors 1010, 1020, 1030, 1040 of the memory cell (B). Each of the word lines (WL5, WL6, WL7, WL8) connects the gate terminal of a respective one of the MFS transistors 1010, 1020, 1030, 1040 of the memory cell (C) and the gate terminal of a respective one of the MFS transistors 1010, 1020, 1030, 1040 of the memory cell (D). Each of the source lines (SL1, SL2) connects the first source/drain terminals of the MFS transistors 1010, 1020, 1030, 1040 of the memory cells (A, B, C, D) in a respective one of the columns. Each of the global bit lines (GBL1, GBL2) connects the first source/drain terminals of the access transistors 1050 of the memory cells (A, B, C, D) in a respective one of the columns. Each of the local bit lines (LBL1, LBL2, LBL3, LBL4) connects the second source/drain terminals of the MFS transistors 1010, 1020, 1030, 1040 and the second source/drain terminal of the access transistor 1050 of a respective one of the memory cells (A, B, C, D).

In some embodiments, the FERAM 1000 further includes a read-write circuit (not shown) connected to the lines (SGL1, SGL2, WL1, WL2, WL3, WL4, WL5, WL6, WL7, WL8, SL1, SL2, GBL1, GBL2, LBL1, LBL2, LBL3, LBL4) and configured to perform read and write operations on the FERAM 1000, in a manner similar to those described above with respect to FERAM 600.

In other embodiments, the FERAM 1000 includes a read-write circuit (not shown) and a refresh circuit (not shown). The read-write circuit is connected to the lines (SGL1, SGL2, WL1, WL2, WL3, WL4, WL5, WL6, WL7, WL8, SL1, SL2, GBL1, GBL2, LBL1, LBL2, LBL3, LBL4) and is configured to perform read and write operations on the FERAM 1000, in a manner similar to those described above with respect to FERAM 600. The refresh circuit is connected to the read-write circuit and is configured to, e.g., periodically, generate a refresh command, in response to which, the read-write circuit reads data from the memory cells (A, B, C, D) and writes the data read thereby back to the memory cells (A, B, C, D) so as to preserve the bits of data stored in the memory cells (A, B, C, D).

Although the arrays are exemplified including only a pair of memory cells per row and a pair of memory cells per column in FIGS. 2-10, it should be understood that any number of memory cells per column/row is within the contemplated scope of the present disclosure.

In an exemplary embodiment, a memory comprises a pair of memory cells and a pair of source lines. Each of the memory cells includes a metal-ferroelectric-semiconductor (MFS) transistor and an access transistor. Each of the source lines is coupled to the access transistor of a respective one of the memory cells.

In another exemplary embodiment, a memory comprises a memory cell and a read-write circuit. The memory cell includes a pair of metal-ferroelectric-semiconductor (MFS) transistors and an access transistor. The read-write circuit is coupled to the memory cell, and is configured to turn on the access transistor and to perform one of a read operation or a write operation on one of the MFS transistors in response to a command.

In another exemplary embodiment, a method comprises applying a first voltage to a first source line of a memory, applying a second voltage to a second source line of the memory, turning on an access transistor of a memory cell of the memory, and performing one of a write operation or a read operation on a metal-ferroelectric-semiconductor (MFS) transistor of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory comprising:
   a memory cell including a pair of metal-ferroelectric-semiconductor (MFS) transistors and an access transistor; and
   a read-write circuit coupled to the memory cell, and configured to turn on the access transistor and to perform one of a read operation or a write operation on one of the MFS transistors in response to a command,
   wherein the memory cell is configured to perform a read operation on a first one of the MFS transistors when a negative voltage is applied to a gate terminal of a second one of the MFS transistors.

2. The memory of claim 1, wherein the access transistor is one of an MFS transistor or a metaloxide-semiconductor (MOS) transistor.

3. The memory of claim 1, further comprising a source line coupling the MFS transistors.

4. The memory of claim 1, further comprising a local bit line coupling the MFS transistors and the access transistor.

5. The memory of claim 1, further comprising a refresh circuit coupled to the read-write circuit and configured to generate a refresh command, wherein the read-write circuit is further configured to read data from the memory cell and to write the data read thereby back to the memory cell in response to the refresh command.

6. A method comprising:
   applying a first voltage to a first source line of a memory;
   applying a second voltage to a second source line of the memory;
   applying the second voltage to a gate terminal of a second metal-ferroelectric-semiconductor (MFS) transistor of a memory cell of the memory;
   turning on an access transistor of the memory cell of the memory;
   performing a write operation on a first metal-ferroelectric-semiconductor (MFS) transistor of the memory cell; and
   performing a read operation on a first one of the MFS transistors when a negative voltage is applied to a gate terminal of a second one of the MFS transistors.

7. The method of claim 6, further comprising turning on an access transistor of a second memory cell of the memory.

8. The method of claim 7, wherein the second voltage is greater than the first voltage.

9. The method of claim 8, further comprising applying the second voltage to one of a source terminal or a drain terminal of an MFS transistor of the second memory cell.

10. The method of claim 7, wherein the second voltage is less than the first voltage.

11. The method of claim 10, further comprising applying the second voltage to one of a source terminal or a drain terminal of an MFS transistor of the second memory cell.

12. A method, comprising:
   applying a first voltage to a first source line of a memory;
   applying a second voltage to a second source line of the memory, wherein the first and second voltages are substantially equal;
   applying a negative voltage to a gate terminal of a second metal-ferroelectric-semiconductor (MFS) transistor of a memory cell of the memory;
   turning on an access transistor of the memory cell; and
   performing a read operation on a first metal-ferroelectric-semiconductor (MFS) transistor of the memory cell.

13. The method of claim 12, further comprising turning on an access transistor of a second memory cell of the memory, and
   applying one of the first voltage or the second voltage to one of a source terminal or a drain terminal of an MFS transistor of the second memory cell.

14. The method of claim 12, further comprising:
   applying a third voltage to the first source line of the memory;
   applying a fourth voltage to the second source line of the memory;
   turning on the access transistor of the memory cell of the memory; and
   performing a write operation on the first metal-ferroelectric-semiconductor (MFS) transistor of the memory cell.

15. The method of claim 14, further comprising applying the fourth voltage to the gate terminal of the second metal-ferroelectric-semiconductor (MFS) transistor of a memory cell of the memory.

16. The method of claim 15, further comprising turning on an access transistor of a second memory cell of the memory.

17. The method of claim 16, wherein the second voltage is greater than the first voltage.

18. The method of claim 17, further comprising applying the second voltage to one of a source terminal or a drain terminal of an MFS transistor of the second memory cell.

19. The method of claim 16, wherein the second voltage is less than the first voltage.

* * * * *